United States Patent
Maziewski et al.

(10) Patent No.: US 10,685,666 B2
(45) Date of Patent: Jun. 16, 2020

(54) AUTOMATIC GAIN ADJUSTMENT FOR IMPROVED WAKE WORD RECOGNITION IN AUDIO SYSTEMS

(71) Applicant: Intel Corporation, Santa Clara, CA (US)

(72) Inventors: Przemyslaw Maziewski, Gdansk (PL); Adam Kupryjanow, Gdansk (PL); Lukasz Kurylo, Gdansk (PL); Pawel Trella, Gdansk (PL)

(73) Assignee: INTEL CORPORATION, Santa Clara, CA (US)

( * ) Notice: Subject to any disclaimer, the term of this patent is extended or adjusted under 35 U.S.C. 154(b) by 106 days.

(21) Appl. No.: 15/946,847

(22) Filed: Apr. 6, 2018

(65) Prior Publication Data

US 2019/0043521 A1   Feb. 7, 2019

(51) Int. Cl.

| | |
|---|---|
| *G10L 21/0364* | (2013.01) |
| *G10L 15/22* | (2006.01) |
| *G10L 15/20* | (2006.01) |
| *G06F 3/16* | (2006.01) |
| *H03G 3/30* | (2006.01) |
| *H04R 29/00* | (2006.01) |
| *H03G 3/34* | (2006.01) |

(52) U.S. Cl.
CPC .......... *G10L 21/0364* (2013.01); *G06F 3/165* (2013.01); *G06F 3/167* (2013.01); *G10L 15/20* (2013.01); *G10L 15/22* (2013.01); *H03G 3/3005* (2013.01); *H03G 3/34* (2013.01); *H04R 29/004* (2013.01); *G10L 2015/223* (2013.01); *H04R 2430/01* (2013.01)

(58) Field of Classification Search
CPC ..... G10L 15/20; G10L 21/0364; G06F 3/165; G06F 3/167; H03G 3/3005; H04R 29/004
See application file for complete search history.

(56) References Cited

U.S. PATENT DOCUMENTS

| | | | | |
|---|---|---|---|---|
| 6,446,039 | B1* | 9/2002 | Miyazawa | G10L 15/06 704/250 |
| 9,424,840 | B1* | 8/2016 | Hart | G10L 15/22 |
| 10,074,371 | B1* | 9/2018 | Wang | G10L 15/22 |
| 2002/0106089 | A1* | 8/2002 | Zheng | H03G 1/02 381/61 |
| 2014/0278443 | A1* | 9/2014 | Gunn | G06F 3/0488 704/275 |
| 2016/0379661 | A1* | 12/2016 | Kar | G10L 21/0232 704/225 |
| 2018/0293999 | A1* | 10/2018 | Walley | G10L 25/84 |
| 2019/0043492 | A1* | 2/2019 | Lang | H04N 21/42203 |

(Continued)

*Primary Examiner* — Paras D Shah
(74) *Attorney, Agent, or Firm* — Jaffery Watson Mendonsa & Hamilton LLP

(57) ABSTRACT

A mechanism is described for facilitating automatic gain adjustment in audio systems according to one embodiment. A method of embodiments, as described herein, includes determining status of one or more of gain settings, mute settings, and boost settings associated with one or more microphones based on a configuration of a computing device including a voice-enabled device. The method may further comprise recommending adjustment of microphone gain based on the configuration and the status of one or more of the gain, mute, and boost settings, and applying the recommended adjustment of the microphone gain.

17 Claims, 9 Drawing Sheets

(56) References Cited

U.S. PATENT DOCUMENTS

| | | | |
|---|---|---|---|
| 2019/0122691 A1* | 4/2019 | Roy | G10L 21/06 |
| 2019/0147905 A1* | 5/2019 | Mai | G06F 21/32 |
| | | | 704/275 |

* cited by examiner

AUTOMATIC GAIN ADJUSTMENT FOR IMPROVED WAKE WORD RECOGNITION IN AUDIO SYSTEMS

FIELD

Embodiments described herein relate generally to data processing and more particularly to facilitate automatic gain adjustment in audio systems.

BACKGROUND

Wake word recognizer (WWR) is a set of techniques allowing to recognize a specific key phrase, aka the wake word. The WWR has a well-defined and optimal microphone input signal level for which it obtains highest recognition rates and thus if a WWR's input signal is close to an optimal level, then that is when the WWR achieves best results. However, WWR are often affected by microphone gain and boost settings controlled by users of a device. Since the signal levels are typically controlled by user, they can easily shift from WWR's optimal values. Conventional techniques fail to protect WWRs from microphone gain and boost changes made by the user or software running on the device.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
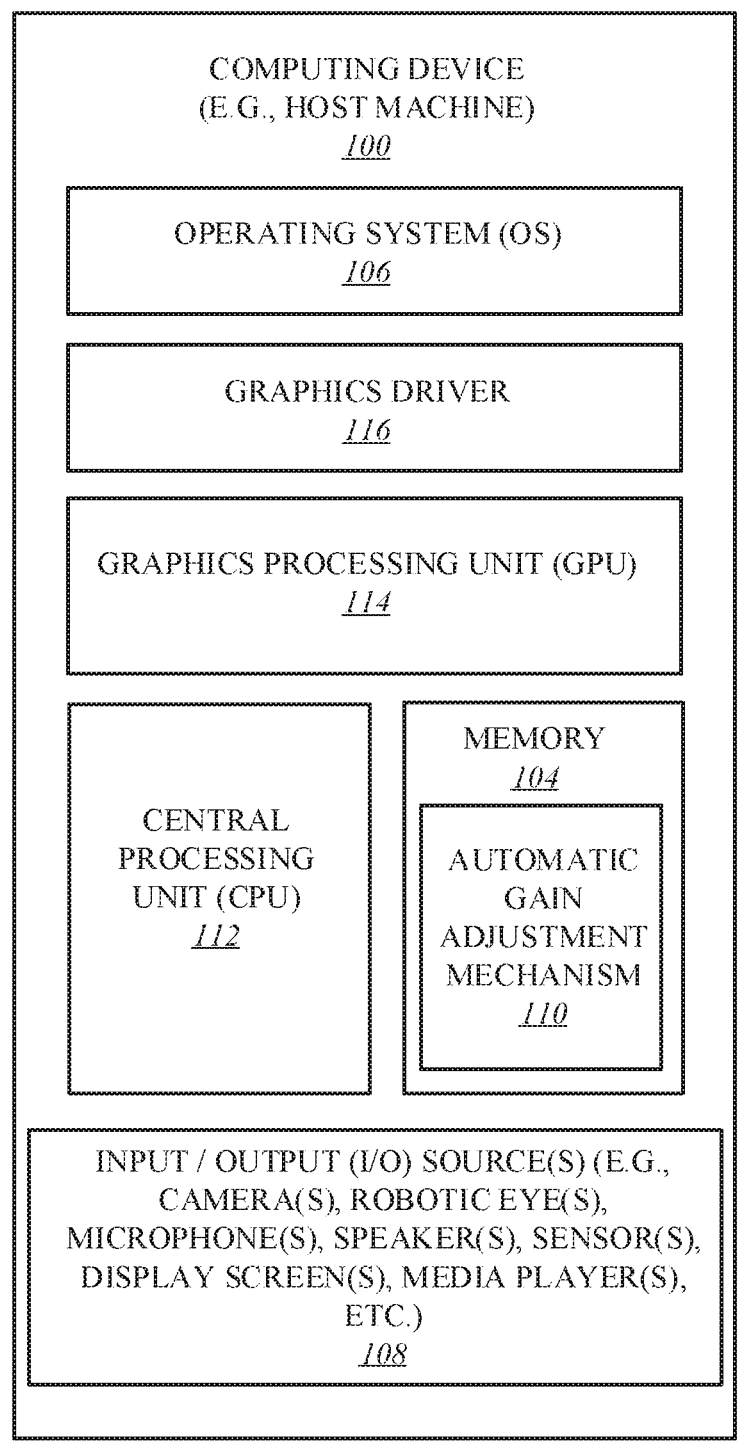
FIG. 1 illustrates a computing device employing an automatic gain adjustment mechanism according to one embodiment.

In the following description, numerous specific details are set forth. However, embodiments, as described herein, may be practiced without these specific details. In other instances, well-known circuits, structures and techniques have not been shown in detail in order not to obscure the understanding of this description.

Embodiments provide for a novel technique for automatic gain adjustment, considering account current microphone gain, boost, and mute settings. Further, this novel technique utilizes microphone sensitivity data available in certain operating systems and predefined optimal signal levels for WWRs. For example, the novel technique may allow for compensation of any microphone signal modifications that occur prior to a WWR, while allowing to obtain optimal signal levels at WWR inputs. In one embodiment, mute applications may be enforced on to WWR signals.

It is contemplated that terms like "request", "query", "job", "work", "work item", and "workload" may be referenced interchangeably throughout this document. Similarly, an "application" or "agent" may refer to or include a computer program, a software application, a game, a workstation application, etc., offered through an application programming interface (API), such as a free rendering API, such as Open Graphics Library (OpenGL®), DirectX® 11, DirectX® 12, etc., where "dispatch" may be interchangeably referred to as "work unit" or "draw" and similarly, "application" may be interchangeably referred to as "workflow" or simply "agent". For example, a workload, such as that of a three-dimensional (3D) game, may include and issue any number and type of "frames" where each frame may represent an image (e.g., sailboat, human face). Further, each frame may include and offer any number and type of work units, where each work unit may represent a part (e.g., mast of sailboat, forehead of human face) of the image (e.g., sailboat, human face) represented by its corresponding frame. However, for the sake of consistency, each item may be referenced by a single term (e.g., "dispatch", "agent", etc.) throughout this document.

In some embodiments, terms like "display screen" and "display surface" may be used interchangeably referring to the visible portion of a display device while the rest of the display device may be embedded into a computing device, such as a smartphone, a wearable device, etc. It is contemplated and to be noted that embodiments are not limited to any particular computing device, software application, hardware component, display device, display screen or surface, protocol, standard, etc. For example, embodiments may be applied to and used with any number and type of real-time applications on any number and type of computers, such as desktops, laptops, tablet computers, smartphones, head-mounted displays and other wearable devices, and/or the like. Further, for example, rendering scenarios for efficient performance using this novel technique may range from simple scenarios, such as desktop compositing, to complex scenarios, such as 3D games, augmented reality applications, etc.

It is to be noted that terms or acronyms like convolutional neural network (CNN), CNN, neural network (NN), NN, deep neural network (DNN), DNN, recurrent neural network (RNN), RNN, and/or the like, may be interchangeably referenced throughout this document. Further, terms like "autonomous machine" or simply "machine", "autonomous vehicle" or simply "vehicle", "autonomous agent" or simply "agent", "autonomous device" or "computing device", "robot", and/or the like, may be interchangeably referenced throughout this document.

FIG. 1 illustrates a computing device 100 employing an automatic gain adjustment mechanism ("adjustment mechanism") 110 according to one embodiment. Computing device 100 represents a communication and data processing device including or representing (without limitations) a voice-enabled device (VED), a voice command device (VCD), and/or the like. Throughout this document, computing device 100 may be interchangeably referred to as "smart voice device" or "smart voice-enabled device" or "voice-enabled device" or "VED" or simply "voice device" that includes or works with or is embedded in or facilitates any number and type of smart devices, such as (without limitation) smart command devices or intelligent personal assistants (e.g., Echo® by Amazon.com®, etc.), home/office automation system, home appliances (e.g., washing machines, television sets, etc.), mobile devices (e.g., smartphones, tablet computers, etc.), gaming devices, handheld devices, wearable devices (e.g., smartwatches, smart bracelets, etc.), virtual reality (VR) devices, head-mounted display (HMDs), Internet of Things (IoT) devices, laptop computers, desktop computers, server computers, set-top boxes (e.g., Internet-based cable television set-top boxes, etc.), global positioning system (GPS)-based devices, automotive infotainment devices, etc.

In some embodiments, voice-enabled device 100 includes or works with or is embedded in or facilitates any number and type of other smart devices, such as (without limitation) autonomous machines or artificially intelligent agents, such as a mechanical agents or machines, electronics agents or machines, virtual agents or machines, electro-mechanical agents or machines, etc. Examples of autonomous machines or artificially intelligent agents may include (without limitation) robots, autonomous vehicles (e.g., self-driving cars, self-flying planes, self-sailing boats, etc.), autonomous equipment (self-operating construction vehicles, self-operating medical equipment, etc.), and/or the like. Further, "autonomous vehicles" are not limed to automobiles but that they may include any number and type of autonomous machines, such as robots, autonomous equipment, household autonomous devices, and/or the like, and any one or more tasks or operations relating to such autonomous machines may be interchangeably referenced with autonomous driving.

Further, for example, voice-enabled device 100 may include a computer platform hosting an integrated circuit ("IC"), such as a system on a chip ("SoC" or "SOC"), integrating various hardware and/or software components of voice-enabled device 100 on a single chip.

As illustrated, in one embodiment, voice-enabled device 100 may include any number and type of hardware and/or software components, such as (without limitation) graphics processing unit ("GPU" or simply "graphics processor") 114, graphics driver (also referred to as "GPU driver", "graphics driver logic", "driver logic", user-mode driver (UMD), UMD, user-mode driver framework (UMDF), UMDF, or simply "driver") 116, central processing unit ("CPU" or simply "application processor") 112, memory 108, network devices, drivers, or the like, as well as input/output (I/O) sources 104, such as touchscreens, touch panels, touch pads, virtual or regular keyboards, virtual or regular mice, ports, connectors, etc. Voice device 100 may include operating system (OS) 106 serving as an interface between hardware and/or physical resources of the voice-enabled device 100 and a user.

It is to be appreciated that a lesser or more equipped system than the example described above may be preferred for certain implementations. Therefore, the configuration of voice-enabled device 100 may vary from implementation to implementation depending upon numerous factors, such as price constraints, performance requirements, technological improvements, or other circumstances.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The terms "logic", "module", "component", "engine", and "mechanism" may include, by way of example, software or hardware and/or a combination thereof, such as firmware.

In one embodiment, as illustrated, adjustment mechanism 110 may be hosted by memory 108 in communication with I/O source(s) 104, such as microphones, speakers, etc., of voice-enabled device 100. In another embodiment, adjustment mechanism 110 may be part of or hosted by operating system 106. In yet another embodiment, adjustment mechanism 110 may be hosted or facilitated by graphics driver 116. In yet another embodiment, adjustment mechanism 110 may be hosted by or part of graphics processing unit ("GPU" or simply graphics processor") 114 or firmware of graphics processor 114. For example, adjustment mechanism 110 may be embedded in or implemented as part of the processing hardware of graphics processor 114. Similarly, in yet another embodiment, adjustment mechanism 110 may be hosted by or part of central processing unit ("CPU" or simply "application processor") 112. For example, adjustment mechanism 110 may be embedded in or implemented as part of the processing hardware of application processor 112.

In yet another embodiment, adjustment mechanism 110 may be hosted by or part of any number and type of components of voice-enabled device 100, such as a portion of adjustment mechanism 110 may be hosted by or part of operating system 116, another portion may be hosted by or part of graphics processor 114, another portion may be hosted by or part of application processor 112, while one or more portions of adjustment mechanism 110 may be hosted by or part of operating system 116 and/or any number and type of devices of computing device 100. It is contemplated that embodiments are not limited to certain implementation or hosting of adjustment mechanism 110 and that one or more portions or components of adjustment mechanism 110 may be employed or implemented as hardware, software, or any combination thereof, such as firmware.

Voice-enabled device 100 may host network interface device(s) to provide access to a network, such as a LAN, a wide area network (WAN), a metropolitan area network (MAN), a personal area network (PAN), Bluetooth, a cloud network, a mobile network (e.g., 3$^{rd}$ Generation (3G), 4$^{th}$ Generation (4G), etc.), an intranet, the Internet, etc. Network interface(s) may include, for example, a wireless network interface having antenna, which may represent one or more antenna(e). Network interface(s) may also include, for example, a wired network interface to communicate with remote devices via network cable, which may be, for example, an Ethernet cable, a coaxial cable, a fiber optic cable, a serial cable, or a parallel cable.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments described herein. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection).

Throughout the document, term "user" may be interchangeably referred to as "viewer", "observer", "speaker", "person", "individual", "end-user", and/or the like. It is to be noted that throughout this document, terms like "graphics domain" may be referenced interchangeably with "graphics processing unit", "graphics processor", or simply "GPU" and similarly, "CPU domain" or "host domain" may be referenced interchangeably with "computer processing unit", "application processor", or simply "CPU".

It is to be noted that terms like "node", "computing node", "server", "server device", "cloud computer", "cloud server", "cloud server computer", "machine", "host machine", "device", "computing device", "computer", "computing system", and the like, may be used interchangeably throughout this document. It is to be further noted that terms like "application", "software application", "program", "software program", "package", "software package", and the like, may be used interchangeably throughout this document. Also, terms like "job", "input", "request", "message", and the like, may be used interchangeably throughout this document.

Figure 2:
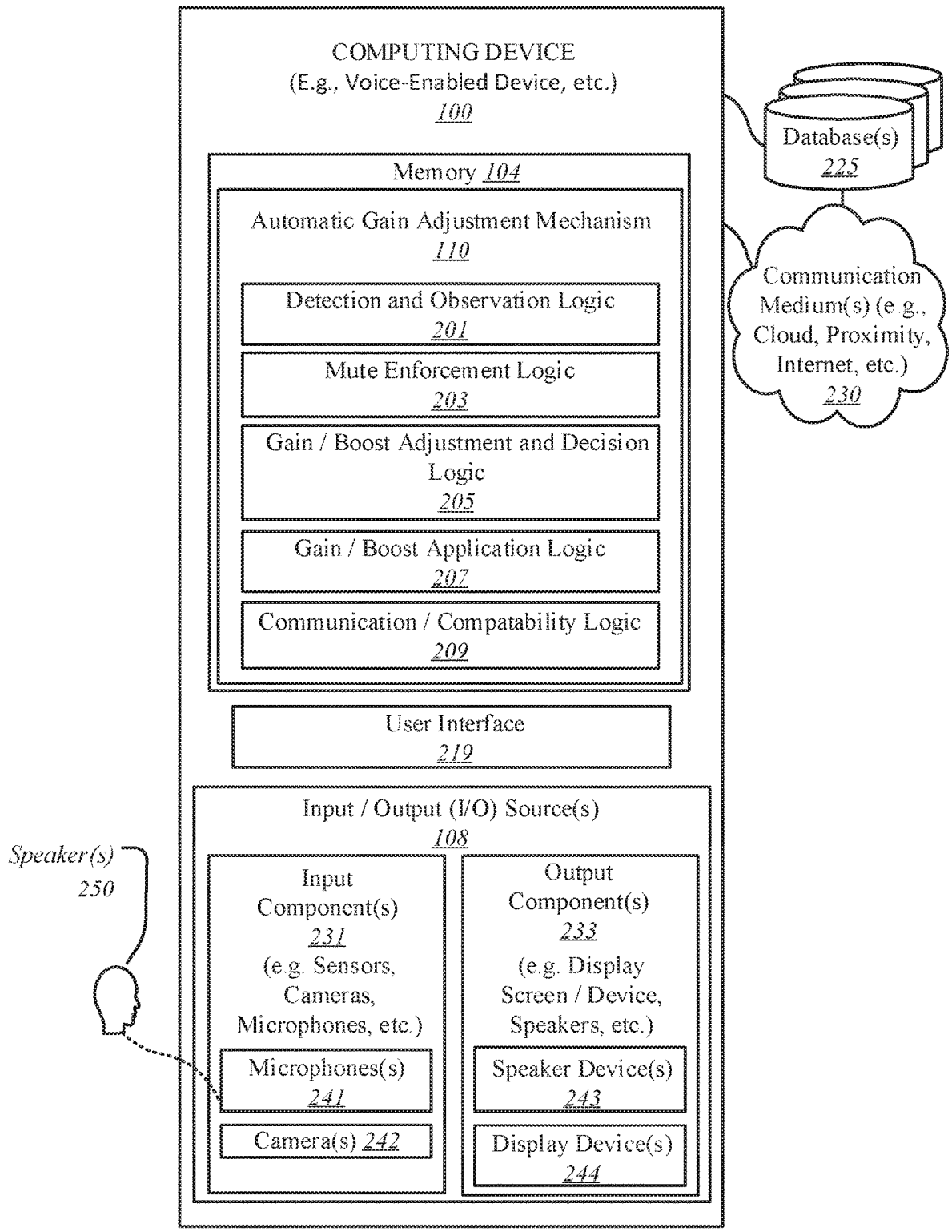
FIG. 2 illustrates automatic gain adjustment mechanism of FIG. 1 according to one embodiment.

FIG. 2 illustrates automatic gain adjustment mechanism 110 of FIG. 1 according to one embodiment. For brevity, many of the details already discussed with reference to FIG. 1 are not repeated or discussed hereafter. In one embodiment, adjustment mechanism 110 may include any number and type of components, such as (without limitations): detection and observation logic 201; mute enforcement logic ("mute logic") 203; gain/boost adjustment and decision logic ("gain/boost logic") 205; gain/boost application logic ("application logic") 207; and communication/compatibility logic 209.

Voice-enabled device 100 is further shown to include user interface 219 (e.g., graphical user interface (GUI)-based user interface, Web browser, cloud-based platform user interface, software application-based user interface, other user or application programming interfaces (APIs), etc.). Voice-enabled device 100 may further include I/O source(s) 108 having input component(s) 231, such as camera(s) 242 (e.g., Intel® RealSense™ camera), sensors, microphone(s) 241, etc., and output component(s) 233, such as display device(s) or simply display(s) 244 (e.g., integral displays, tensor displays, projection screens, display screens, etc.), speaker devices(s) or simply speaker(s) 243, etc.

Voice-enabled device 100 is further illustrated as having access to and/or being in communication with one or more database(s) 225 and/or one or more of other computing devices over one or more communication medium(s) 230 (e.g., networks such as a proximity network, a cloud network, the Internet, etc.).

In some embodiments, database(s) 225 may include one or more of storage mediums or devices, repositories, data sources, etc., having any amount and type of information, such as data, metadata, etc., relating to any number and type of applications, such as data and/or metadata relating to one or more users, physical locations or areas, applicable laws, policies and/or regulations, user preferences and/or profiles, security and/or authentication data, historical and/or preferred details, and/or the like.

As aforementioned, voice-enabled device 100 may host I/O sources 108 including input component(s) 231 and output component(s) 233. In one embodiment, input component(s) 231 may include a sensor array including, but not limited to, microphone(s) 241 (e.g., ultrasound microphones), camera(s) 242 (e.g., two-dimensional (2D) cameras, three-dimensional (3D) cameras, infrared (IR) cameras, depth-sensing cameras, etc.), capacitors, radio components, radar components, scanners, and/or accelerometers, etc. Similarly, output component(s) 233 may include any number and type of display device(s) 244, projectors, light-emitting diodes (LEDs), speaker(s) 243, and/or vibration motors, etc.

For example, as illustrated, input component(s) 231 may include any number and type of microphones(s) 241, such as multiple microphones or a microphone array, such as ultrasound microphones, dynamic microphones, fiber optic microphones, laser microphones, etc. It is contemplated that one or more of microphone(s) 241 serve as one or more input devices for accepting or receiving audio inputs (such as human voice) into voice-enabled device 100 and converting this audio or sound into electrical signals. Similarly, it is contemplated that one or more of camera(s) 242 serve as one or more input devices for detecting and capturing of image and/or videos of scenes, objects, etc., and provide the captured data as video inputs into voice-enabled device 100.

It is contemplated that embodiments are not limited to any number or type of microphone(s) 241, camera(s) 243, speaker(s) 243, display(s) 244, etc. For example, as facilitated by detection and observation logic 201, one or more of microphone(s) 241 may be used to detect speech or sound (e.g., WWR) simultaneously from multiple users or speakers, such as speaker(s) 250. Similarly, as facilitated by detection and observation logic 201, one or more of camera(s) 242 may be used to capture images or videos of a geographic location (such as a room) and its contents (e.g., furniture, electronic devices, humans, animals, plats, etc.) and form a set of images or a video stream.

Similarly, as illustrated, output component(s) 233 may include any number and type of speaker(s) 243 to serve as output devices for outputting or giving out audio from voice-enabled device 100 for any number or type of reasons, such as human hearing or consumption. For example, speaker(s) 243 work the opposite of microphone(s) 241 where speaker(s) 243 convert electric signals into sound.

To avoid any potential confusion of terms, it is contemplated and to be noted that "speaker(s)" 250 refers to users or individuals or humans who speak into voice-enabled device 100 using their voices or sounds, like WWRs, while "speakers" or "speaker device(s)" 243 are part of output component(s) 233 and refer to one or more output devices coupled to or embedded into voice-enabled device 100 to convert electric signals into sound.

As described above, a WWR, also known as a wake on voice or key phrase recognizer, includes well-defined and optimal input signal levels for which it acquires high recognition rates and thus the closer to the optimal level, better the results of the WWR. However, hand signals that are inputted into WWR can vary based on the type of devices, platforms, operation systems, etc. For example, on certain operation systems, these optimal levels can be affected by microphone gain and boost settings when such optimal levels are controlled or provided by users. Stated differently, signal levels are user-specific and can easily shift from WWR's optimal values. Further, in some cases, mute settings are not applied to the microphone signals before reaching WWRs, which can lead to a situation when a voice-enabled device is awaken by a spoken word even when the device's microphones are shut from the user perspective.

Typically, microphone gain and boost levels are set early during the tune stage, but WWR is not protected from gain and boost changes made by the user or software application running on a device, such as Skype® application with automatic gain control, etc.) during the lifetime of the device. Thus, any changes in the gain and boost can shift the microphone signal levels away from the WWR's optimum performance. Further, with current operation systems' audio stack architecture, there are no guarantees that the microphone mute can be applied before reaching the WWR.

Embodiments provide for a novel technique that allows for microphone gain and boost settings compensation for microphone(s) 241 as facilitated by gain/boost logic 205 and application logic 207 and further, using mute logic 203, applies and enforces mute to WWR signals if the user has requested the mute. In one embodiment, using adjustment mechanism 110, automatic gain adjustment is employed to consider the current microphone gain, boost, and mute settings as detected and observed by detection and observation logic 201 and facilitated by gain/boost logic 205. Further, for example, microphone sensitivity data associated with and available in certain operating systems may utilized for pre-defined optimal signal level for WWR signals as facilitated by gain/boost logic 205. This novel technique proposes compensation that allows for obtaining optimal signal levels at the WWR input, while enforcing mute applications to WWR input signals as facilitated by mute logic 203.

Embodiments further provide for maintaining of optimal input signal levels for WWR signals, while removing the need for initial tuning of the device, such as voice-enabled device 100, in acoustical sense as any gain compensation happens automatically. Further, using mute logic 203, this novel technique enforces mute settings, which leads to much better user experience, such as the user may be confused when they mute microphone, while voice-enabled device 100 is still responding to the user's commands.

For example, as illustrated and described with reference to FIGS. 3A, 3B, 3C, 3D and FIG. 4, given the current audio stack architecture of various operating systems, four options for facilitating gain, boost, and mute settings and implementations are described. For example, in one embodiment, adjustment mechanism 110 is triggered with detection and observation logic 201 with detection of noise or sound from speaker(s) 250 as captured by microphone(s) 241 and observation of that sound along with any pending commands, such as a mute command, from speaker(s) 250 of voice-enabled device 100. In another embodiment, this detection and observation may occur at or on the operation system level (e.g., at operating system 106 of FIG. 1) such as through monitoring the gain and boost settings via drivers or other types of software, etc.

In one embodiment, if there is a mute command pending from speaker(s) 250, detection and observation logic 201 detects the command and communicates the command and any other relevant information (such as for how long the mute command is to be applied, etc.) to mute logic 203. In another embodiment, mute is applied manually by the user, such as speaker(s) 250, operating system settings. Upon receiving such information, mute logic 203 ensures that the mute option on voice-enable device 100 remains active and enforced in accordance with the mute command placed by the user. For example, if the user wishes to mute voice-enabled device 100 for three hours as detected and observed by detection and observation logic 201, then mute logic 203 ensure that one or more microphone(s) 241 at voice-enabled device 100 remain mute for the requested length of time.

In one embodiment, gain/boost logic 205 is triggered to determine whether any microphone gain associated with microphone(s) 241 is applied before a WWR signal. If microphone gain is not applied before the WWR signal, then, as facilitated by gain/boost logic 205, another determination is made as to whether any microphone boost associated with microphone(s) 241 is applied before the WWR signal. If not, then gain compensation is applied according to formula 1 as facilitated by gain/boost logic 205 and application logic 207 as illustrated in scenario 300 of FIG. 3A, where formula 1 includes:

$$\text{gain [dB]} = s_0 - s_m$$

Where, $s_0$ refers to the optimal WWR sensitivity represented in $dB_{fs}/Pa$ or in another unit, and where $s_m$ refers to the microphone sensitivity represented in $dB_{fs}/Pa$ or in another unit. Since microphone master volume and microphone boost 303 do not affect WWR input signal, microphone gain 301 is equal to difference between optimal sensitivity and microphone sensitivity. This equation or formula is applied when the gain, mute, and boost of microphone(s) 241 are applied in, for example, an audio service layer, such as a higher layer of the operating system.

Figure 3A:
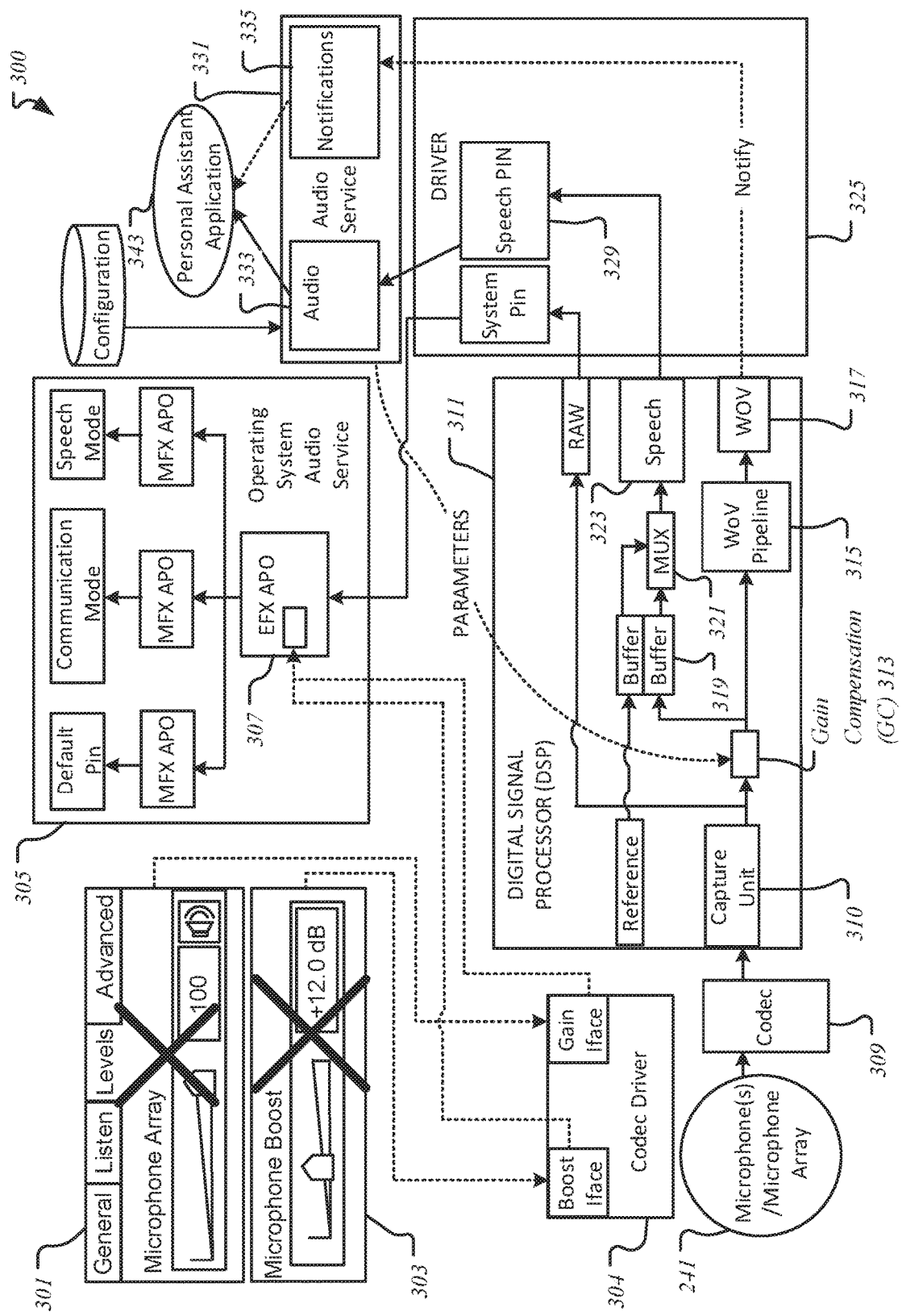
FIG. 3A illustrates a device configuration where microphone gain and microphone boost are not applied prior to reaching a WWR according to one embodiment.

Stated differently, now referring to FIG. 3A, in this use-case scenario 300, the microphone signal changes after the WWR signal, so the gain, boost, and mute setting do not modify the level of signal that enters the WWR block, such as Wake On Voice (WOV) 317. Thus, in this scenario 300, gain compensation (GC) unit 313 at digital signal processor (DSP) 311 needs only to mute the microphone signal, if the user, such as speaker(s) 250 of FIG. 2, requested the muting of microphone(s) 241, before it enters WOV 317 as facilitated by application logic 207. In one embodiment, GC unit 313 may be a component of software, hardware, or a combination thereof hosted by or embedded at DSP 311 and as facilitated by adjustment mechanism 110 to perform its task associated with the novel technique discussed throughout this document.

As further illustrated in FIG. 3A, in this scenario 340, microphone(s) or microphone array 241 serve as listening or input device, where both microphone gain 301 and microphone boost 303 are not applied before WWR (as represented by "X"). Any gains and boots run through codec driver 304 and further into endpoint effects (EFX) audio processing object (APO) block 307 and further onto other components (such mode effects (MFX) APO, followed by default pin, communication mode, speech mode, MFX APO, etc.) of operating system audio service block 305. Similarly, a signal received at microphone(s) 241 runs through codec 309 and then captured at DSP 311 by capture component 310 and passes through various components, such as GC unit 313, buffer 319, multiplexer 321, speech block 323 along with WOV pipeline 315 and WOV 317. In continuing with it, the audio signal communication continues through speech pin 329 of driver 325 to audio block 333 of audio service block 331 and then on to speaker(s) 243, while the notification portion of the communication continues with WOV block 327 and through notification block 335 of audio block 333 of audio service block 331 and then on to personal assistant application 343.

It is contemplated and noted that embodiments are not limited or specific to any one operating system and that the situation can be similar with regard to other operating systems in the sense that boost/gain control may happened before or after the WWR.

Figure 3B:
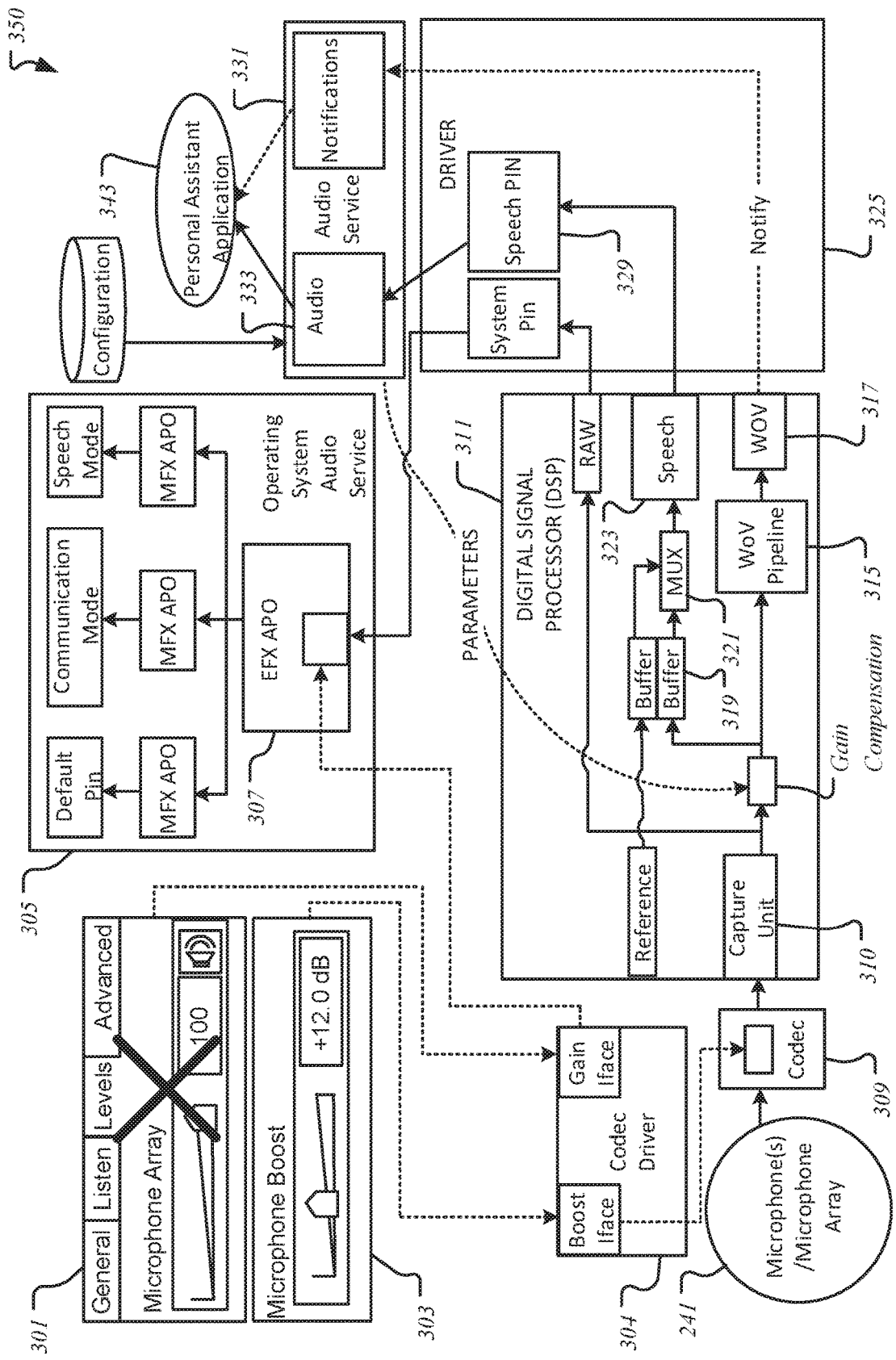
FIG. 3B illustrates a device configuration where microphone gain is not applied prior to reaching a WWR, while microphone boost is applied prior to reaching the WWR according to one embodiment.

Now, as shown in FIG. 3B, if microphone gain 301 is not applied before WWR, but microphone boost 303 is applied before WWR as shown with respect to scenario 350 of FIG. 3B, then the gain compensation is applied according to formula 2 as facilitated by gain/boost logic 205 and application logic 207 as illustrated in scenario 350 of FIG. 3B, where formula 2 includes:

$$\text{gain [dB]} = s_0 - (s_m + g_B)$$

Where, $s_0$ refers to the optimal WWR sensitivity represented in $dB_{fs}$/Pa, where $s_m$ refers to the microphone sensitivity represented in $dB_{fs}$/Pa, and where $g_B$ refers to the microphone boost represented in dB.

Referring to FIG. 3B, since the master volume of microphone(s) 241 may not affect the WWR input signal, in this scenario 350, gain is determined to be equal to the difference between any optimal sensitivity and the sum of microphone sensitivity and microphone boost 303. Further, in this scenario 350, microphone boost 303 is applied before the signal reaches WWR, where microphone gain 301 and mute are applied in OS audio service block 305 after WWR and further, in this scenario 350, GB unit 313 compensates boost 303 and applies the mute as facilitated by application logic 207 and mute logic 203, respectively.

Further, in this scenario 350 of FIG. 3B, microphone(s) or microphone array 241 serve as listening or input devices for signals, such as WWR signals, where microphone gain 301 is not applied before WWR (as represented by "X"), but microphone boost 303 is applied before WWR. Any gains and boots run through codec driver 304 and, like scenario 300 of FIG. 3A, in this scenario 350, microphone gain 301 feeds into EFX APO 307 and further onto other components (such MFX APO, followed by default pin, communication mode, speech mode, MFX APO, etc.) of OS audio service block 305. However, unlike scenario 300 of FIG. 3A, in this scenario 350, microphone boost 303 continues onto codec 309 as directed by codec driver 304.

Similarly, a signal received at microphone(s) 241 runs through codec 309 along with microphone boost 303 and then captured at DSP 311 by capture component 310 and passes through various components, such as GC unit 313, buffer 319, multiplexer 321, speech block 323 along with WOV pipeline 315 and WOV 317. In continuing with it, the audio signal communication continues through speech pin 329 of driver 325 to audio block 333 of audio service block 331 and then onto speaker(s) 243, while the notification portion of the communication continues with WOV block 327 and through notification block 335 of audio block 333 of audio service block 331 and then onto personal assistant application 343.

Figure 3C:
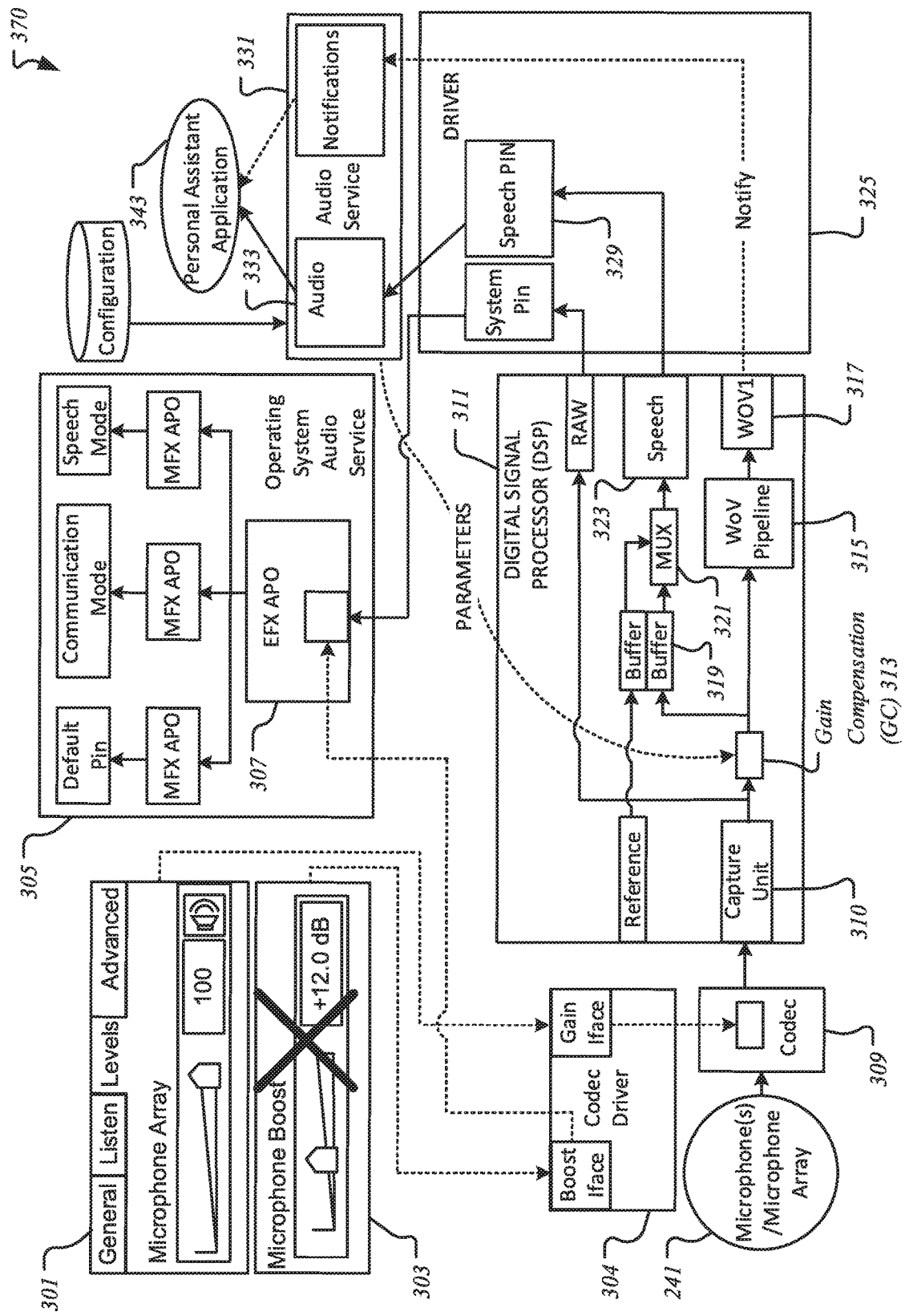
FIG. 3C illustrates a device configuration where microphone gain is applied prior to reaching a WWR, while microphone boost is not applied prior to reaching the WWR according to one embodiment.

As illustrated in FIG. 3C, if microphone gain 301 is applied before WWR, but microphone boost 303 is not applied before WWR as shown with respect to scenario 370 of FIG. 3C, then gain compensation is applied according to formula 3 as facilitated by gain/boost logic 205 and application logic 207 and as illustrated in scenario 370 of FIG. 3C, where formula 3 includes:

$$\text{gain [dB]} = s_0 - (s_m + g_{MV})$$

Where, $s_0$ refers to the optimal WWR sensitivity represented in $dB_{fs}$/Pa, where $s_m$ is refers to the microphone sensitivity represented in $dB_{fs}$/Pa, and where $g_{MV}$ refers to the microphone master volume represented in dB.

In this scenario 370, since microphone boost 303 does not affect WWR input signal, microphone gain 301 is equal to the difference between optimal sensitivity and sum of microphone sensitivity, and microphone master volume. As illustrated, in scenario 370, a use-case is demonstrated where microphone gain 301 and mute are applied before the signal reaches the WWR (such as in codec 309 as facilitated by application logic 207 and mute logic 203, respectively. Further, microphone boost 303 is applied in OS audio service block 305 as facilitated by application logic 207, while GC unit 313 compensates gain changes as further facilitated by application logic 207.

Further, in this scenario 370 of FIG. 3C, microphone(s) or microphone array 241 serve as listening or input devices for signals, such as WWR signals, where microphone gain 301 is applied before WWR (as represented by "X"), but microphone boost 303 is not applied before WWR. Any gain 301 and boost 303 go through codec driver 304 such that microphone boost 303 feeds into EFX APO 307 and further onto other components (such MFX APO, followed by default pin, communication mode, speech mode, MFX APO, etc.) of OS audio service block 305, while microphone gain 301 continues onto codec 309 as directed by codec driver 304.

Similarly, a signal received at microphone(s) 241 runs through codec 309 along with microphone boost 303 and then captured at DSP 311 by capture component 310 and passes through various components, such as GC unit 313, buffer 319, multiplexer 321, speech block 323 along with WOV pipeline 315 and WOV 317. In continuing with it, the audio signal communication continues through speech pin 329 of driver 325 to audio block 333 of audio service block 331 and then onto speaker(s) 243, while the notification portion of the communication continues with WOV block 327 and through notification block 335 of audio block 333 of audio service block 331 and then onto personal assistant application 343.

Figure 3D:
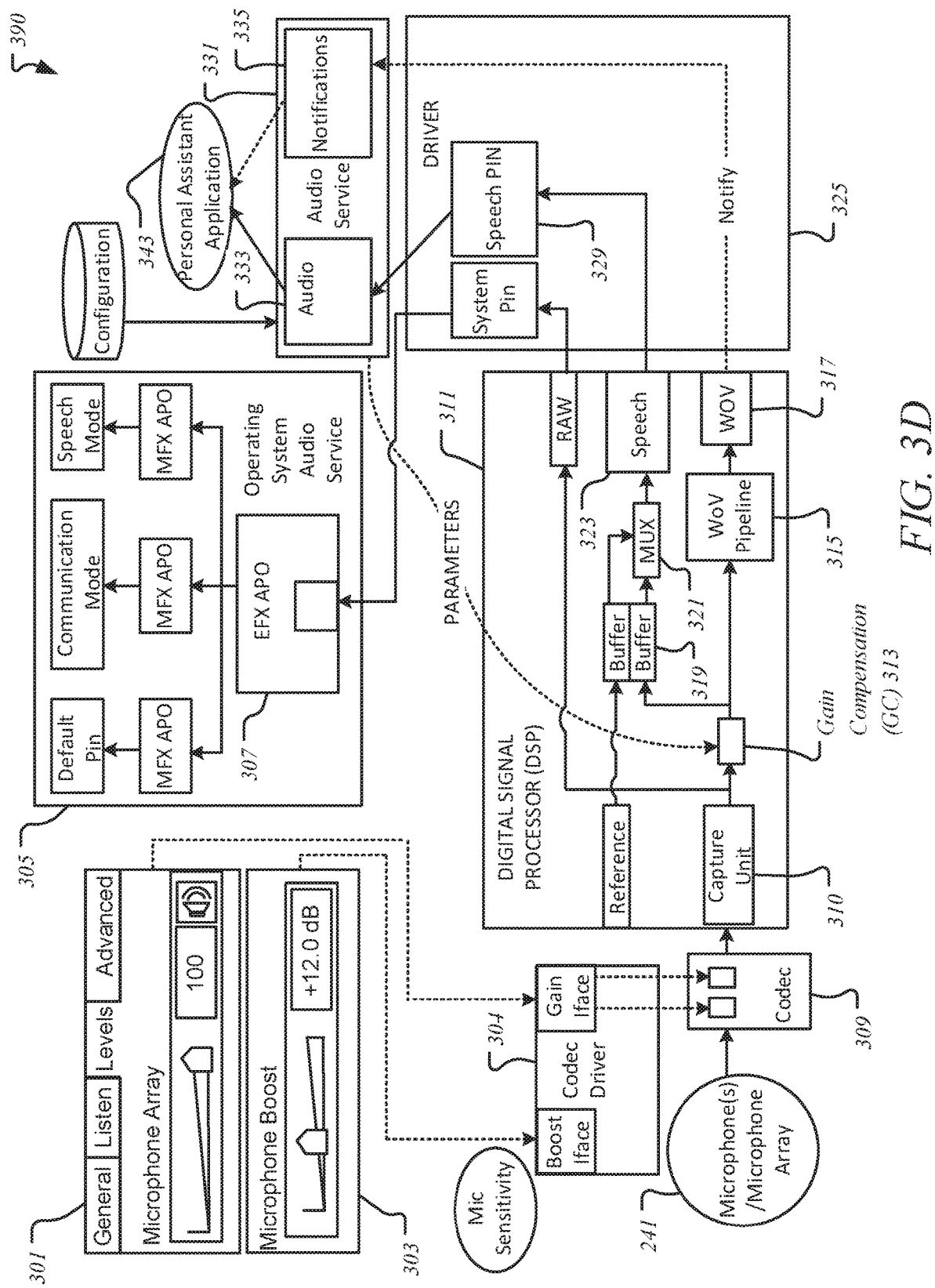
FIG. 3D illustrates a device configuration where microphone gain and microphone boost are applied prior to reaching a WWR according to one embodiment.

As illustrated in scenario 390 of FIG. 3D, if both microphone gain 301 and microphone boost 303 are applied before WWR, then gain compensation is applied according to formula 4 as facilitated by gain/boost logic 205 and application logic 207 and as illustrated in scenario 390 of FIG. 3D, where formula 4 includes $$\text{gain [dB]} = s_0 - (s_m + g_{MV} + g_B)$$

Where, $s_0$ refers to the optimal WWR sensitivity represented in $dB_{fs}$/Pa, where $s_m$ refers to the microphone sensitivity represented in $dB_{fs}$/Pa, where $g_{MV}$ refers to the microphone master volume represented in dB, and where $g_B$ refers to microphone boost 303 represented in dB. Since, in this scenario 390, both microphone master volume and microphone boost 303 affect WWR input signal, gain 301 is equal to the difference between optimal sensitivity and the sum of microphone sensitivity, microphone master volume, and microphone boost 303. Further, in this scenario 390, gain 301, boost 303 and mute are applied in codec 309 as facilitated by application logic 207 and mute logic 203, while both gain 301 and boost 303 are compensated by GC unit 313 as facilitated by application logic 207.

Further, in this scenario 390 of FIG. 3D, microphone(s) or microphone array 241 serve as listening or input devices for signals, such as WWR signals, where microphone gain 301 and microphone boost 303 are applied in codec 309 as directed by codec driver 304 such that microphone gain 301 and boost 303 are captured at DSP 311 by capture component 310 and passes through various components, such as GC unit 313, buffer 319, multiplexer 321, speech block 323 along with WOV pipeline 315 and WOV 317. In continuing with it, the audio signal communication continues through speech pin 329 of driver 325 to audio block 333 of audio service block 331 and then onto speaker(s) 243, while the notification portion of the communication continues with WOV block 327 and through notification block 335 of audio block 333 of audio service block 331 and then onto personal assistant application 343.

In further reference to formulae 1-4, optimal WWR sensitivity ($s_0$) equals +8 dBfs/Pa for certain WWR technology, but embodiments are not limited as such as this value can change with in accordance with various WWR implementations. It is contemplated and to be noted that embodiments are not limited or specific to any units and that WWR sensitivity may be expressed in various other units as well. Further, normal speech may have sound pressure level (SPL) of around 65 $dB_{20\ \mu Pa}$ and about 85 $dB_{20\ \mu Pa}$ peak value at near field distances (0.5-1 m). These values may be lower in far field (e.g., distance between the microphone and the user b>=1 m) due to sound attenuation with distance, where the +8 dBfs/Pa sensitivity allows high speech signal level in digital domain in far field scenarios, while having no overdrive at normal speech in near field. The equation below (1) illustrates headroom calculation for a near-field speech captured with the +8 dBfs/Pa sensitivity which, in turn, may result in selected sensitivity allowing for a −1 dBfs headroom:

$$85\ dB_{20\ \mu Pa} + 8\ dB_{fs}/Pa = 85\ dB_{20\ \mu Pa} + (8-94)dB_{fs}/20\ \mu Pa = -1\ dB_{fs}$$

Referring back to FIG. 2, input component(s) 231 may further include any number and type of cameras, such as depth-sensing cameras or capturing devices (e.g., Intel® RealSense™ depth-sensing camera) that are known for capturing still and/or video red-green-blue (RGB) and/or RGB-depth (RGB-D) images for media, such as personal media. Such images, having depth information, have been effectively used for various computer vision and computational photography effects, such as (without limitations) scene understanding, refocusing, composition, cinemagraphs, etc. Similarly, for example, displays may include any number and type of displays, such as integral displays, tensor displays, stereoscopic displays, etc., including (but not limited to) embedded or connected display screens, display devices, projectors, etc.

Input component(s) 231 may further include one or more of vibration components, tactile components, conductance elements, biometric sensors, chemical detectors, signal detectors, electroencephalography, functional near-infrared spectroscopy, wave detectors, force sensors (e.g., accelerometers), illuminators, eye-tracking or gaze-tracking system, head-tracking system, etc., that may be used for capturing any amount and type of visual data, such as images (e.g., photos, videos, movies, audio/video streams, etc.), and non-visual data, such as audio streams or signals (e.g., sound, noise, vibration, ultrasound, etc.), radio waves (e.g., wireless signals, such as wireless signals having data, metadata, signs, etc.), chemical changes or properties (e.g., humidity, body temperature, etc.), biometric readings (e.g., figure prints, etc.), brainwaves, brain circulation, environmental/weather conditions, maps, etc. It is contemplated that "sensor" and "detector" may be referenced interchangeably throughout this document. It is further contemplated that one or more input component(s) 231 may further include one or more of supporting or supplemental devices for capturing and/or sensing of data, such as illuminators (e.g., IR illuminator), light fixtures, generators, sound blockers, etc.

It is further contemplated that in one embodiment, input component(s) 231 may further include any number and type of context sensors (e.g., linear accelerometer) for sensing or detecting any number and type of contexts (e.g., estimating horizon, linear acceleration, etc., relating to a mobile computing device, etc.). For example, input component(s) 231 may include any number and type of sensors, such as (without limitations): accelerometers (e.g., linear accelerometer to measure linear acceleration, etc.); inertial devices (e.g., inertial accelerometers, inertial gyroscopes, micro-electro-mechanical systems (MEMS) gyroscopes, inertial navigators, etc.); and gravity gradiometers to study and measure variations in gravitation acceleration due to gravity, etc.

Further, for example, input component(s) 231 may include (without limitations): audio/visual devices (e.g., cameras, microphones, speakers, etc.); context-aware sensors (e.g., temperature sensors, facial expression and feature measurement sensors working with one or more cameras of audio/visual devices, environment sensors (such as to sense background colors, lights, etc.); biometric sensors (such as to detect fingerprints, etc.), calendar maintenance and reading device), etc.; global positioning system (GPS) sensors; resource requestor; and/or TEE logic. TEE logic may be employed separately or be part of resource requestor and/or an I/O subsystem, etc. Input component(s) 231 may further include voice recognition devices, photo recognition devices, facial and other body recognition components, voice-to-text conversion components, etc.

Similarly, output component(s) 233 may include dynamic tactile touch screens having tactile effectors as an example of presenting visualization of touch, where an embodiment of such may be ultrasonic generators that can send signals in space which, when reaching, for example, human fingers can cause tactile sensation or like feeling on the fingers. Further, for example and in one embodiment, output component(s) 233 may include (without limitation) one or more of light sources, display devices and/or screens, audio speakers, tactile components, conductance elements, bone conducting speakers, olfactory or smell visual and/or non/visual presentation devices, haptic or touch visual and/or non-visual presentation devices, animation display devices, biometric display devices, X-ray display devices, high-resolution displays, high-dynamic range displays, multi-view displays, and head-mounted displays (HMDs) for at least one of virtual reality (VR) and augmented reality (AR), etc.

It is contemplated that embodiment are not limited to any number or type of use-case scenarios, architectural placements, or component setups; however, for the sake of brevity and clarity, illustrations and descriptions are offered and discussed throughout this document for exemplary purposes but that embodiments are not limited as such. Further, throughout this document, "user" may refer to someone having access to one or more computing devices, such as voice-enabled device 100, and may be referenced interchangeably with "person", "individual", "human", "him", "her", "child", "adult", "viewer", "player", "gamer", "developer", programmer", and/or the like.

Communication/compatibility logic 209 may be used to facilitate dynamic communication and compatibility between various components, networks, computing devices, database(s) 225, and/or communication medium(s) 230, etc., and any number and type of other computing devices (such as wearable computing devices, mobile computing devices, desktop computers, server computing devices, etc.), processing devices (e.g., central processing unit (CPU), graphics processing unit (GPU), etc.), capturing/sensing components (e.g., non-visual data sensors/detectors, such as audio sensors, olfactory sensors, haptic sensors, signal sensors, vibration sensors, chemicals detectors, radio wave detectors, force sensors, weather/temperature sensors, body/biometric sensors, scanners, etc., and visual data sensors/detectors, such as cameras, etc.), user/context-awareness components and/or identification/verification sensors/devices (such as biometric sensors/detectors, scanners, etc.), memory or storage devices, data sources, and/or database(s) (such as data storage devices, hard drives, solid-state drives, hard disks, memory cards or devices, memory circuits, etc.), network(s) (e.g., Cloud network, Internet, Internet of Things, intranet, cellular network, proximity networks, such as Bluetooth, Bluetooth low energy (BLE), Bluetooth Smart, Wi-Fi proximity, Radio Frequency Identification, Near Field Communication, Body Area Network, etc.), wireless or wired communications and relevant protocols (e.g., Wi-Fi®, WiMAX, Ethernet, etc.), connectivity and location management techniques, software applications/websites, (e.g., social and/or business networking websites, business applications, games and other entertainment applications, etc.), programming languages, etc., while ensuring compatibility with changing technologies, parameters, protocols, standards, etc.

Throughout this document, terms like "logic", "component", "module", "framework", "engine", "tool", "circuitry", and/or the like, may be referenced interchangeably and include, by way of example, software, hardware, and/or any combination of software and hardware, such as firmware. In one example, "logic" may refer to or include a software component that works with one or more of an operating system, a graphics driver, etc., of a computing device, such as voice-enabled device 100. In another example, "logic" may refer to or include a hardware component that is capable of being physically installed along with or as part of one or more system hardware elements, such as an application processor, a graphics processor, etc., of a computing device, such as voice-enabled device 100. In yet another embodiment, "logic" may refer to or include a firmware component that is capable of being part of system firmware, such as firmware of an application processor or a graphics processor, etc., of a computing device, such as voice-enabled device 100.

Further, any use of a particular brand, word, term, phrase, name, and/or acronym, such as "voice device", "voice-enabled device", "wake word recognizer", "WWR", "microphone gain", "microphone boost", "mute", "gain compensation", "boost compensation", "GC block", "RealSense™ camera", "real-time", "automatic", "dynamic", "user interface", "camera", "sensor", "microphone", "display screen", "speaker", "verification", "authentication", "privacy", "user", "user profile", "user preference", "sender", "receiver", "personal device", "smart device", "mobile computer", "wearable device", "IoT device", "proximity network", "cloud network", "server computer", etc., should not be read to limit embodiments to software or devices that carry that label in products or in literature external to this document.

It is contemplated that any number and type of components may be added to and/or removed from adjustment mechanism 110 to facilitate various embodiments including adding, removing, and/or enhancing certain features. For brevity, clarity, and ease of understanding of dereverberation mechanism 110, many of the standard and/or known components, such as those of a computing device, are not shown or discussed here. It is contemplated that embodiments, as described herein, are not limited to any technology, topology, system, architecture, and/or standard and are dynamic enough to adopt and adapt to any future changes.

As already discussed with reference to FIG. 2, FIG. 3A illustrates a device configuration where microphone gain and microphone boost are not applied prior to reaching a WWR according to one embodiment.

As already discussed with reference to FIG. 2, FIG. 3B illustrates a device configuration where microphone gain is not applied prior to reaching a WWR, while microphone boost is applied prior to reaching the WWR according to one embodiment.

As already discussed with reference to FIG. 2, FIG. 3C illustrates a device configuration where microphone gain is applied prior to reaching a WWR, while microphone boost is not applied prior to reaching the WWR according to one embodiment.

As already discussed with reference to FIG. 2, FIG. 3D illustrates a device configuration where microphone gain and microphone boost are applied prior to reaching a WWR according to one embodiment.

Figure 4:
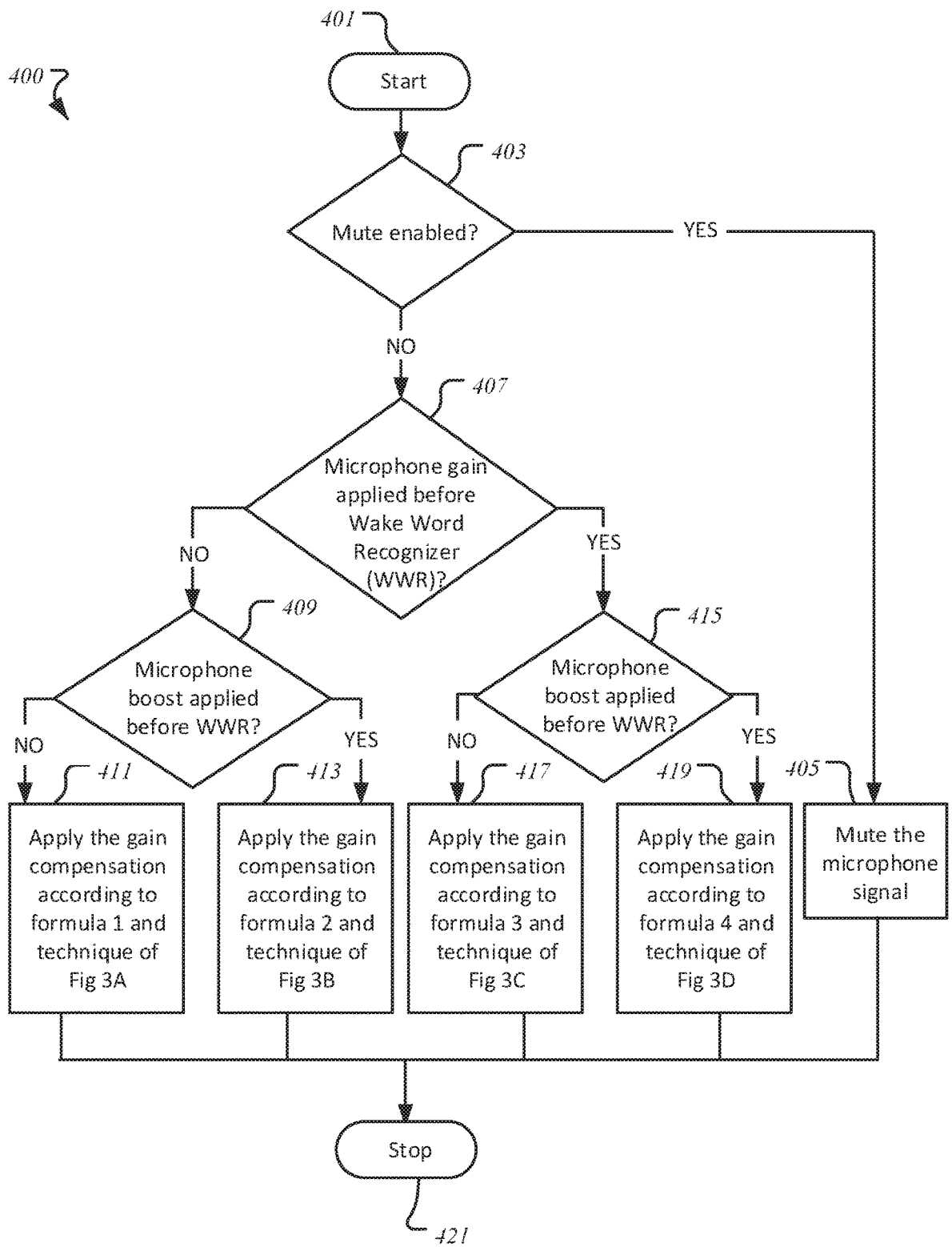
FIG. 4 illustrates a method for facilitating automatic gain adjustment for improved WWR in audio system according to one embodiment.

FIG. 4 illustrates a method 400 for facilitating automatic gain adjustment for improved WWR in audio system according to one embodiment. For brevity, many of the details previously discussed with reference to FIGS. 1-4 may not be discussed or repeated hereafter. Any processes or transactions may be performed by processing logic that may comprise hardware (e.g., circuitry, dedicated logic, programmable logic, etc.), software (such as instructions run on a processing device), or a combination thereof, as facilitated by adjustment mechanism 110 of FIG. 1 and/or GC unit 313 of FIGS. 3A-3D. Any processes or transactions associated with this illustration may be illustrated or recited in linear sequences for brevity and clarity in presentation; however, it is contemplated that any number of them can be performed in parallel, asynchronously, or in different orders.

Method 400 starts at block 401, followed by block 403 where a determination is made as to whether mute on a voice-enabled device is enabled, such as commanded by a user of the voice-enabled device or set by the user via the OS options. If the mute is enabled, such as through a mute command placed by the user (e.g., by speaking into or touching the voice-enabled device), at block 405, any further microphone signals into one or more microphones of the voice-enabled device are mute.

At block 407, another determination is made as to whether any microphone gain is applied before WWR. If not, then method 400 continues at block 409 with yet another determination as to whether microphone boost is applied before WWR. In one embodiment, if the boost is not applied (and the gain is also not applied) before WWR, then at block 411, gain compensation is applied according to formula 1 of FIG. 3A and method 400 ends at block 421, where since microphone master volume and the microphone boost do not affect the WWR input signal, any gain is regarded as equal to the difference between optimal sensitivity and microphone sensitivity.

In another embodiment, if the boost is applied (but the gain is not applied) before WWR, then at block 413, gain compensation is applied according to formula 2 of FIG. 3B and method 400 ends at block 421, where microphone master volume does not affect the WWR input signal, any gain is regarded as equal to the difference between optimal sensitivity and the sum of microphone sensitivity and microphone boost.

Referring back to block 407, if the microphone gain is not applied before WWR, then at block 415, another determination is made as to whether the microphone boost is applied before WWR. In yet another embodiment, if the boost is not applied (but the gain is applied) before WWR, then at block 417, gain compensation is applied according to formula 3 of FIG. 3C and method 400 ends at block 421, where since the microphone boost does not affect the WWR input signal, any gain is regarded as equal to the difference between optimal sensitivity and the sum of microphone sensitivity and microphone master volume.

In yet another embodiment, if the microphone boost is applied (and the gain is also applied) before WWR, then at block 419, gain compensation is applied according to formula 4 of FIG. 3d and method 400 ends at block 421, where since both microphone master volume and the microphone boost affect WWR input signal, any gain is regarded as equal to the difference between optimal sensitivity and the sum of microphone sensitivity, microphone master volume, and the microphone boost.

Figure 5:
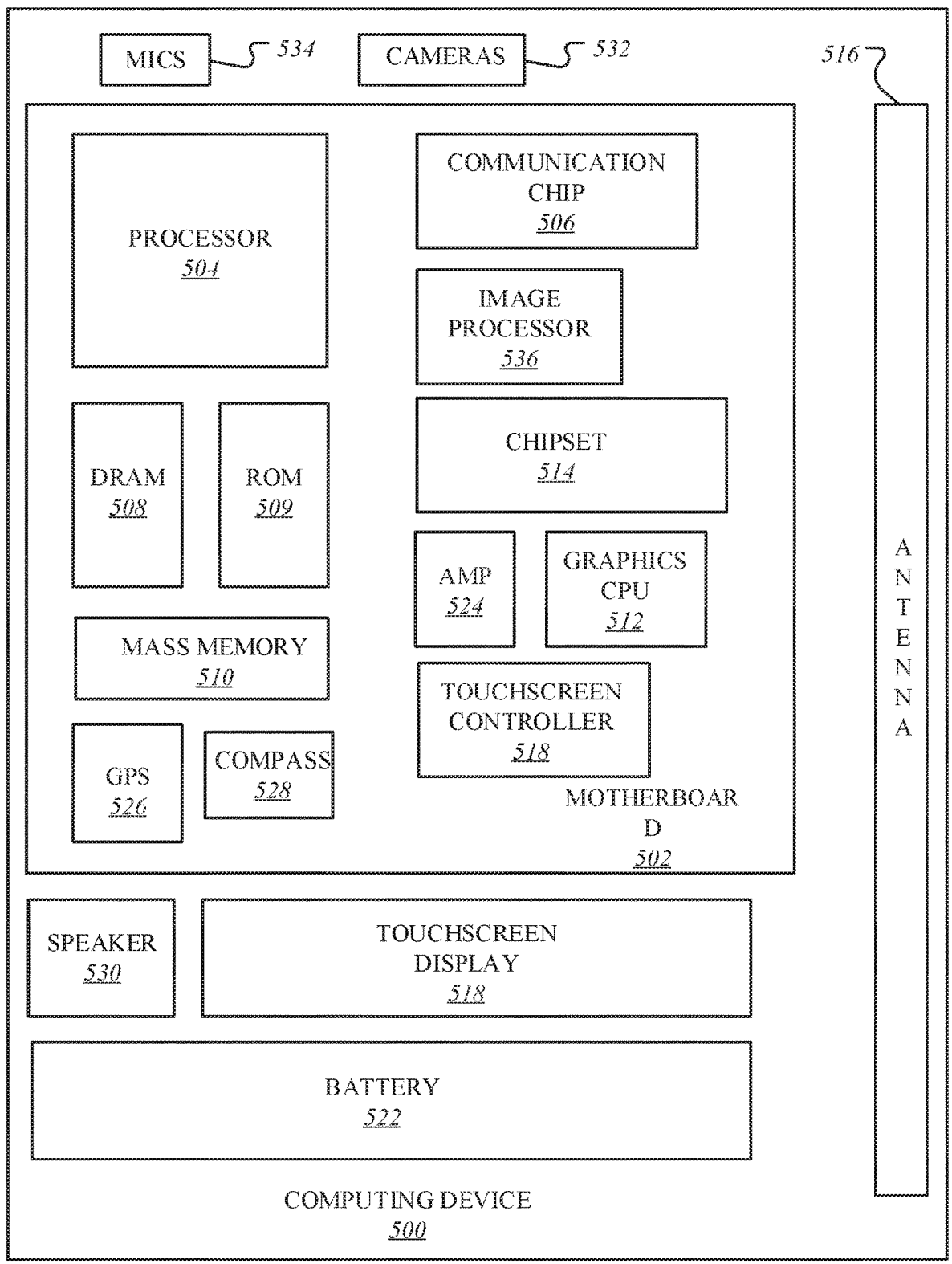
FIG. 5 illustrates a computer device capable of supporting and implementing one or more embodiments according to one embodiment.

FIG. 5 illustrates a computing device 500 in accordance with one implementation. The illustrated computing device 500 may be same as or similar to computing device 100 of FIG. 1. The computing device 500 houses a system board 502. The board 502 may include a number of components, including but not limited to a processor 504 and at least one communication package 506. The communication package is coupled to one or more antennas 516. The processor 504 is physically and electrically coupled to the board 502.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, cameras 532, a microphone array 534, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication package 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication packages 506. For instance, a first communication package 506 may be dedicated to shorter range wireless communications such as Wi-Fi and Bluetooth and a second communication package 506 may be dedicated to longer range wireless communications such as GPS, EDGE, GPRS, CDMA, WiMAX, LTE, Ev-DO, and others.

The cameras 532 including any depth sensors or proximity sensor are coupled to an optional image processor 536 to perform conversions, analysis, noise reduction, comparisons, depth or distance analysis, image understanding and other processes as described herein. The processor 504 is coupled to the image processor to drive the process with interrupts, set parameters, and control operations of image processor and the cameras. Image processing may instead be performed in the processor 504, the graphics CPU 512, the cameras 532, or in any other device.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable. In further implementations, the computing device 500 may be any other electronic device that processes data or records data for processing elsewhere.

Embodiments may be implemented using one or more memory chips, controllers, CPUs (Central Processing Unit), microchips or integrated circuits interconnected using a motherboard, an application specific integrated circuit (ASIC), and/or a field programmable gate array (FPGA). The term "logic" may include, by way of example, software or hardware and/or combinations of software and hardware.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Embodiments may be provided, for example, as a computer program product which may include one or more transitory or non-transitory machine-readable storage media having stored thereon machine-executable instructions that, when executed by one or more machines such as a computer, network of computers, or other electronic devices, may result in the one or more machines carrying out operations in accordance with embodiments described herein. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Figure 6:
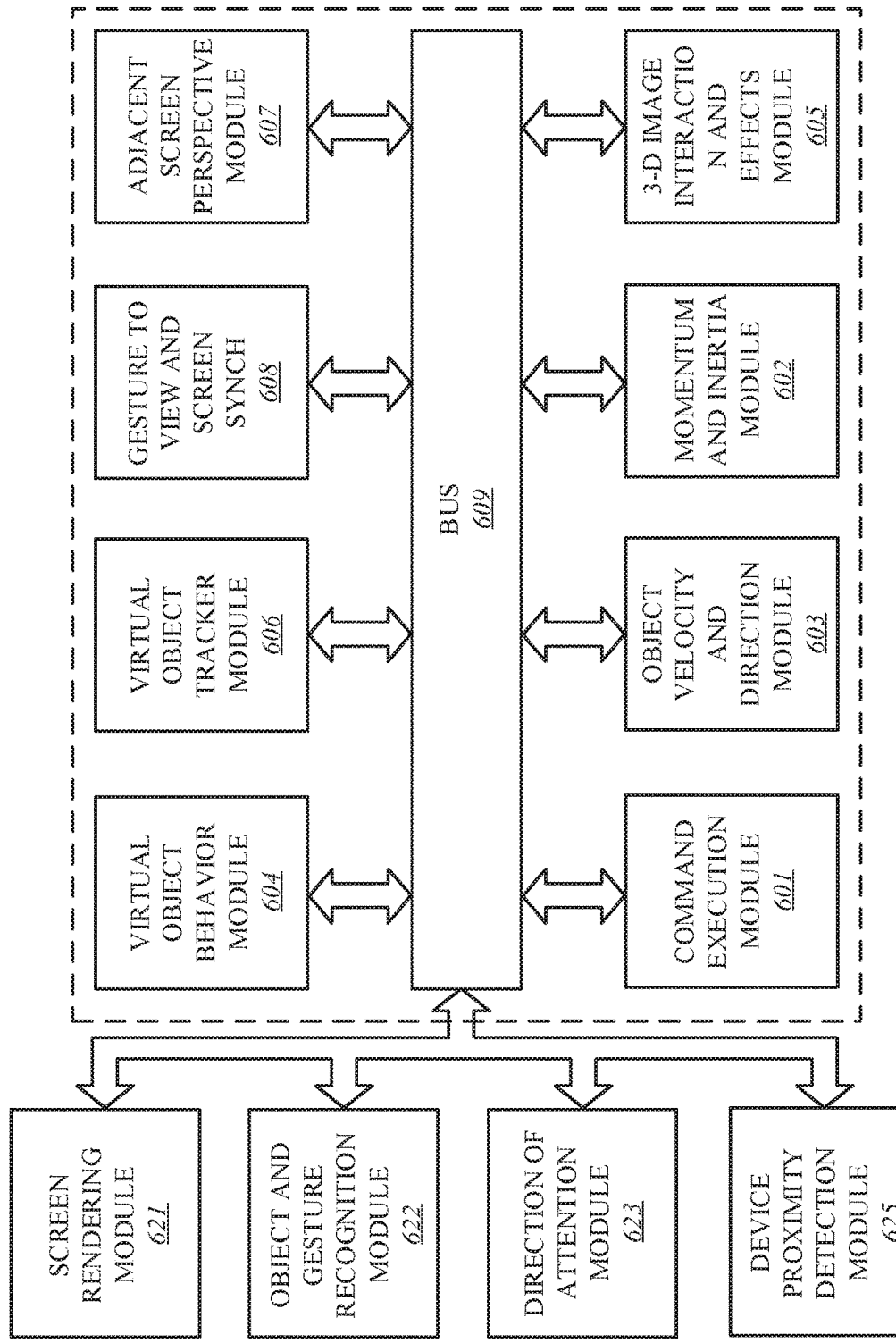
FIG. 6 illustrates an embodiment of a computing environment capable of supporting and implementing one or more embodiments according to one embodiment.

FIG. 6 illustrates an embodiment of a computing environment 600 capable of supporting the operations discussed above. The modules and systems can be implemented in a variety of different hardware architectures and form factors including that shown in FIG. 5.

The Command Execution Module 601 includes a central processing unit to cache and execute commands and to distribute tasks among the other modules and systems shown. It may include an instruction stack, a cache memory to store intermediate and final results, and mass memory to store applications and operating systems. The Command Execution Module may also serve as a central coordination and task allocation unit for the system.

The Screen Rendering Module 621 draws objects on the one or more multiple screens for the user to see. It can be adapted to receive the data from the Virtual Object Behavior Module 604, described below, and to render the virtual object and any other objects and forces on the appropriate screen or screens. Thus, the data from the Virtual Object Behavior Module would determine the position and dynamics of the virtual object and associated gestures, forces and objects, for example, and the Screen Rendering Module would depict the virtual object and associated objects and environment on a screen, accordingly. The Screen Rendering Module could further be adapted to receive data from the Adjacent Screen Perspective Module 607, described below, to either depict a target landing area for the virtual object if the virtual object could be moved to the display of the device with which the Adjacent Screen Perspective Module is associated. Thus, for example, if the virtual object is being moved from a main screen to an auxiliary screen, the Adjacent Screen Perspective Module 2 could send data to the Screen Rendering Module to suggest, for example in shadow form, one or more target landing areas for the virtual object on that track to a user's hand movements or eye movements.

The Object and Gesture Recognition Module 622 may be adapted to recognize and track hand and arm gestures of a user. Such a module may be used to recognize hands, fingers, finger gestures, hand movements and a location of hands relative to displays. For example, the Object and Gesture Recognition Module could for example determine that a user made a body part gesture to drop or throw a virtual object onto one or the other of the multiple screens, or that the user made a body part gesture to move the virtual object to a bezel of one or the other of the multiple screens. The Object and Gesture Recognition System may be coupled to a camera or camera array, a microphone or microphone array, a touch screen or touch surface, or a pointing device, or some combination of these items, to detect gestures and commands from the user.

The touch screen or touch surface of the Object and Gesture Recognition System may include a touch screen sensor. Data from the sensor may be fed to hardware, software, firmware or a combination of the same to map the touch gesture of a user's hand on the screen or surface to a corresponding dynamic behavior of a virtual object. The sensor date may be used to momentum and inertia factors to allow a variety of momentum behavior for a virtual object based on input from the user's hand, such as a swipe rate of a user's finger relative to the screen. Pinching gestures may be interpreted as a command to lift a virtual object from the display screen, or to begin generating a virtual binding associated with the virtual object or to zoom in or out on a display. Similar commands may be generated by the Object and Gesture Recognition System using one or more cameras without the benefit of a touch surface.

The Direction of Attention Module 623 may be equipped with cameras or other sensors to track the position or orientation of a user's face or hands. When a gesture or voice command is issued, the system can determine the appropriate screen for the gesture. In one example, a camera is mounted near each display to detect whether the user is facing that display. If so, then the direction of attention module information is provided to the Object and Gesture Recognition Module 622 to ensure that the gestures or commands are associated with the appropriate library for the active display. Similarly, if the user is looking away from all of the screens, then commands can be ignored.

The Device Proximity Detection Module 625 can use proximity sensors, compasses, GPS (global positioning system) receivers, personal area network radios, and other types of sensors, together with triangulation and other techniques to determine the proximity of other devices. Once a nearby device is detected, it can be registered to the system and its type can be determined as an input device or a display device or both. For an input device, received data may then be applied to the Object Gesture and Recognition Module 622. For a display device, it may be considered by the Adjacent Screen Perspective Module 607.

The Virtual Object Behavior Module 604 is adapted to receive input from the Object Velocity and Direction Module, and to apply such input to a virtual object being shown in the display. Thus, for example, the Object and Gesture Recognition System would interpret a user gesture and by mapping the captured movements of a user's hand to recognized movements, the Virtual Object Tracker Module would associate the virtual object's position and movements to the movements as recognized by Object and Gesture Recognition System, the Object and Velocity and Direction Module would capture the dynamics of the virtual object's movements, and the Virtual Object Behavior Module would receive the input from the Object and Velocity and Direction Module to generate data that would direct the movements of the virtual object to correspond to the input from the Object and Velocity and Direction Module.

The Virtual Object Tracker Module 606 on the other hand may be adapted to track where a virtual object should be located in three-dimensional space in a vicinity of a display, and which body part of the user is holding the virtual object, based on input from the Object and Gesture Recognition Module. The Virtual Object Tracker Module 606 may for example track a virtual object as it moves across and between screens and track which body part of the user is holding that virtual object. Tracking the body part that is holding the virtual object allows a continuous awareness of the body part's air movements, and thus an eventual awareness as to whether the virtual object has been released onto one or more screens.

The Gesture to View and Screen Synchronization Module 608, receives the selection of the view and screen or both from the Direction of Attention Module 623 and, in some cases, voice commands to determine which view is the active view and which screen is the active screen. It then causes the relevant gesture library to be loaded for the Object and Gesture Recognition Module 622. Various views of an application on one or more screens can be associated with alternative gesture libraries or a set of gesture templates for a given view. As an example, in FIG. 1A, a pinch-release gesture launches a torpedo, but in FIG. 1B, the same gesture launches a depth charge.

The Adjacent Screen Perspective Module 607, which may include or be coupled to the Device Proximity Detection Module 625, may be adapted to determine an angle and position of one display relative to another display. A projected display includes, for example, an image projected onto a wall or screen. The ability to detect a proximity of a nearby screen and a corresponding angle or orientation of a display projected therefrom may for example be accomplished with either an infrared emitter and receiver, or electromagnetic or photo-detection sensing capability. For technologies that allow projected displays with touch input, the incoming video can be analyzed to determine the position of a projected display and to correct for the distortion caused by displaying at an angle. An accelerometer, magnetometer, compass, or camera can be used to determine the angle at which a device is being held while infrared emitters and cameras could allow the orientation of the screen device to be determined in relation to the sensors on an adjacent device. The Adjacent Screen Perspective Module 607 may, in this way, determine coordinates of an adjacent screen relative to its own screen coordinates. Thus, the Adjacent Screen Perspective Module may determine which devices are in proximity to each other, and further potential targets for moving one or more virtual objects across screens. The Adjacent Screen Perspective Module may further allow the position of the screens to be correlated to a model of three-dimensional space representing all of the existing objects and virtual objects.

The Object and Velocity and Direction Module 603 may be adapted to estimate the dynamics of a virtual object being moved, such as its trajectory, velocity (whether linear or angular), momentum (whether linear or angular), etc. by receiving input from the Virtual Object Tracker Module. The Object and Velocity and Direction Module may further be adapted to estimate dynamics of any physics forces, by for example estimating the acceleration, deflection, degree of stretching of a virtual binding, etc. and the dynamic behavior of a virtual object once released by a user's body part. The Object and Velocity and Direction Module may also use image motion, size and angle changes to estimate the velocity of objects, such as the velocity of hands and fingers The Momentum and Inertia Module 602 can use image motion, image size, and angle changes of objects in the image plane or in a three-dimensional space to estimate the velocity and direction of objects in the space or on a display. The Momentum and Inertia Module is coupled to the Object and Gesture Recognition Module 622 to estimate the velocity of gestures performed by hands, fingers, and other body parts and then to apply those estimates to determine momentum and velocities to virtual objects that are to be affected by the gesture.

The 3D Image Interaction and Effects Module 605 tracks user interaction with 3D images that appear to extend out of one or more screens. The influence of objects in the z-axis (towards and away from the plane of the screen) can be calculated together with the relative influence of these objects upon each other. For example, an object thrown by a user gesture can be influenced by 3D objects in the foreground before the virtual object arrives at the plane of the screen. These objects may change the direction or velocity of the projectile or destroy it entirely. The object can be rendered by the 3D Image Interaction and Effects Module in the foreground on one or more of the displays. As illustrated, various components, such as components 601, 602, 603, 604, 605. 606, 607, and 608 are connected via an interconnect or a bus, such as bus 609.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to perform acts of the method, or of an apparatus or system for facilitating hybrid communication according to embodiments and examples described herein.

Some embodiments pertain to Example 1 that includes an apparatus to facilitate gain adjustment for improved wake word recognition in audio systems, the apparatus comprising: detection and observation logic to determine status of one or more of gain settings, mute settings, and boost settings associated with one or more microphones based on a configuration of the apparatus including a voice-enabled device; gain/boost adjustment and decision logic ("gain/boost logic") to recommend adjustment of microphone gain based on the configuration and the status of one or more of the gain, mute, and boost settings; and gain/boost application logic ("application logic") to apply the recommended adjustment of the microphone gain.

Example 2 includes the subject matter of Example 1, further comprising mute enforcement logic to enforce muting of the one or more microphones based on the mute settings and according to a mute command.

Example 3 includes the subject matter of Examples 1-2, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

Example 4 includes the subject matter of Examples 1-3, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

Example 5 includes the subject matter of Examples 1-4, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

Example 6 includes the subject matter of Examples 1-5, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

Example 7 includes the subject matter of Examples 1-6, wherein the voice-enabled device comprises one or more processors including a graphics processor co-located with an application processor on a common semiconductor package.

Some embodiments pertain to Example 8 that includes a method facilitating gain adjustment for improved wake word recognition in audio systems, the method comprising: determining status of one or more of gain settings, mute settings, and boost settings associated with one or more microphones based on a configuration of a computing device including a voice-enabled device; recommending adjustment of microphone gain based on the configuration and the status of one or more of the gain, mute, and boost settings; and applying the recommended adjustment of the microphone gain.

Example 9 includes the subject matter of Example 8, further comprising enforcing muting of the one or more microphones based on the mute settings and according to a mute command.

Example 10 includes the subject matter of Examples 8-9, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

Example 11 includes the subject matter of Examples 8-10, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

Example 12 includes the subject matter of Examples 8-11, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

Example 13 includes the subject matter of Examples 8-12, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

Example 14 includes the subject matter of Examples 8-13, wherein the voice-enabled device comprises one or more processors including a graphics processor co-located with an application processor on a common semiconductor package.

Some embodiments pertain to Example 15 that includes a data processing system comprising a computing device having a memory device coupled to a processing device, the processing device to perform operations comprising: determining status of one or more of gain settings, mute settings, and boost settings associated with one or more microphones based on a configuration of a computing device including a voice-enabled device; recommending adjustment of microphone gain based on the configuration and the status of one or more of the gain, mute, and boost settings; and applying the recommended adjustment of the microphone gain.

Example 16 includes the subject matter of Example 15, wherein the operations further comprise enforcing muting of the one or more microphones based on the mute settings and according to a mute command.

Example 17 includes the subject matter of Examples 15-16, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

Example 18 includes the subject matter of Examples 15-17, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

Example 19 includes the subject matter of Examples 15-18, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

Example 20 includes the subject matter of Examples 15-19, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

Example 21 includes the subject matter of Examples 15-20, wherein the voice-enabled device comprises one or more processors including a graphics processor co-located with an application processor on a common semiconductor package.

Some embodiments pertain to Example 22 that includes an apparatus to facilitate gain adjustment for improved wake word recognition in audio systems, the apparatus comprising: means for determining status of one or more of gain settings, mute settings, and boost settings associated with one or more microphones based on a configuration of a computing device including a voice-enabled device; means for recommending adjustment of microphone gain based on the configuration and the status of one or more of the gain, mute, and boost settings; and means for applying the recommended adjustment of the microphone gain.

Example 23 includes the subject matter of Example 22, further comprising means for enforcing muting of the one or more microphones based on the mute settings and according to a mute command.

Example 24 includes the subject matter of Examples 22-23, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

Example 25 includes the subject matter of Examples 22-24, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

Example 26 includes the subject matter of Examples 22-25, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

Example 27 includes the subject matter of Examples 22-26, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

Example 28 includes the subject matter of Examples 22-27, wherein the voice-enabled device comprises one or more processors including a graphics processor co-located with an application processor on a common semiconductor package.

Example 29 includes at least one non-transitory or tangible machine-readable medium comprising a plurality of instructions, when executed on a computing device, to implement or perform a method as claimed in any of claims or examples 8-14.

Example 30 includes at least one machine-readable medium comprising a plurality of instructions, when executed on a computing device, to implement or perform a method as claimed in any of claims or examples 8-14.

Example 31 includes a system comprising a mechanism to implement or perform a method as claimed in any of claims or examples 8-14.

Example 32 includes an apparatus comprising means for performing a method as claimed in any of claims or examples 8-14.

Example 33 includes a computing device arranged to implement or perform a method as claimed in any of claims or examples 8-14.

Example 34 includes a communications device arranged to implement or perform a method as claimed in any of claims or examples 8-14.

Example 35 includes at least one machine-readable medium comprising a plurality of instructions, when executed on a computing device, to implement or perform a method or realize an apparatus as claimed in any preceding claims.

Example 36 includes at least one non-transitory or tangible machine-readable medium comprising a plurality of instructions, when executed on a computing device, to implement or perform a method or realize an apparatus as claimed in any preceding claims.

Example 37 includes a system comprising a mechanism to implement or perform a method or realize an apparatus as claimed in any preceding claims.

Example 38 includes an apparatus comprising means to perform a method as claimed in any preceding claims.

Example 39 includes a computing device arranged to implement or perform a method or realize an apparatus as claimed in any preceding claims.

Example 40 includes a communications device arranged to implement or perform a method or realize an apparatus as claimed in any preceding claims.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. An apparatus comprising:
one or more processors to:
determine status of one or more of gain settings, mute settings, and boost settings associated with one or more microphones based on a configuration of the apparatus including a voice-enabled device;
recommend adjustment of microphone gain based on the configuration and the status of one or more of the gain, mute, and boost settings; and
apply the recommended adjustment of the microphone gain, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

2. The apparatus of claim 1, wherein the one or more processors to enforce muting of the one or more microphones based on the mute settings and according to a mute command.

3. The apparatus of claim 1, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

4. The apparatus of claim 1, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

5. The apparatus of claim 1, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

6. The apparatus of claim 1, wherein the voice-enabled device comprises one or more processors including a graphics processor co-located with an application processor on a common semiconductor package.

7. A method comprising:
determining status of one or more of gain settings, mute settings, and boost settings associated with one or more microphones based on a configuration of a computing device including a voice-enabled device;
recommending adjustment of microphone gain based on the configuration and the status of one or more of the gain, mute, and boost settings; and
applying the recommended adjustment of the microphone gain, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

8. The method of claim 7, further comprising enforcing muting of the one or more microphones based on the mute settings and according to a mute command.

9. The method of claim 7, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

10. The method of claim 7, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

11. The method of claim 7, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR.

12. The method of claim 7, wherein the voice-enabled device comprises one or more processors including a graphics processor co-located with an application processor on a common semiconductor package.

13. At least one non-transitory machine-readable medium comprising instructions which, when executed by a computing device, cause the computing device to perform operations comprising:
determining status of one or more of gain settings, mute settings, and boost settings associated with one or more microphones based on a configuration of the computing device including a voice-enabled device;
recommending adjustment of microphone gain based on the configuration and the status of one or more of the gain, mute, and boost settings; and
applying the recommended adjustment of the microphone gain, wherein the recommended adjustment comprises a first gain compensation including muting one or more microphone signals before the one or more microphone signals enter a wake word recognizer (WWR) based on the configuration where the gain and boost settings do not modify signal reception capabilities of the WWR.

14. The non-transitory machine-readable medium of claim 13, further comprising enforcing muting of the one or more microphones based on the mute settings and according to a mute command.

15. The non-transitory machine-readable medium of claim 13, wherein the recommended adjustment comprises a second gain compensation including compensating microphone boost and muting the one or more microphone signals before the one or more microphone signals enter the wake word recognizer (WWR) based on the configuration where the gain settings are not applied before the WWR, while the boost settings are applied before the WWR with a potential for modifying the signal reception capabilities of the WWR.

16. The non-transitory machine-readable medium of claim 13, wherein the recommended adjustment comprises a third gain compensation including compensating microphone gain changes based on the configuration where the boost settings are not applied before the WWR, while the mute and gain settings are applied before the WWR with the potential for modifying the signal reception capabilities of the WWR.

17. The non-transitory machine-readable medium of claim 13, wherein the recommended adjustment comprises a fourth gain compensation including compensating microphone boost changes and the microphone gain changes based on the configuration where the gain, mute, and boost settings applied in a codec before the WWR with the potential for modifying the signal reception capabilities of the WWR, wherein the voice-enabled device comprises one or more processors including a graphics processor co-located with an application processor on a common semiconductor package.

* * * * *